United States Patent [19]

Pinkhasov

[11] Patent Number: 5,011,638

[45] Date of Patent: * Apr. 30, 1991

[54] METHOD OF MAKING OPEN-PORE STRUCTURES

[75] Inventor: Eduard Pinkhasov, Eastchester, N.Y.

[73] Assignee: Vapor Technologies, Inc., Mt. Vernon, N.Y.

[*] Notice: The portion of the term of this patent subsequent to Dec. 4, 2007 has been disclaimed.

[21] Appl. No.: 283,174

[22] Filed: Dec. 9, 1988

Related U.S. Application Data

[63] Continuation-in-part of Ser. No. 208,886, Jun. 17, 1988, Pat. No. 4,975,230.

[51] Int. Cl.⁵ .................... C04B 33/32; B22D 23/00
[52] U.S. Cl. .................................. 264/59; 264/81; 164/46
[58] Field of Search ................... 264/44, 59, 81; 428/613; 204/192.38; 427/37; 164/46

[56] References Cited

U.S. PATENT DOCUMENTS 4,076,888 2/1978 Perugini et al. .................... 428/613

Primary Examiner—James Lowe
Assistant Examiner—Christopher A. Fiorilla
Attorney, Agent, or Firm—Herbert Dubno

[57] ABSTRACT

The formation of an openwork structure e.g., of metal, utilizing low-temperature arc vapor deposition on a foam which is destroyed by pyrolysis is enhanced by applying a portion of the metal in a metal spray of powders in a binder which is also pyrolytically destroyed. The product has essentially the same properties as one made exclusively by the low-temperature arc vapor deposition method.

18 Claims, 1 Drawing Sheet

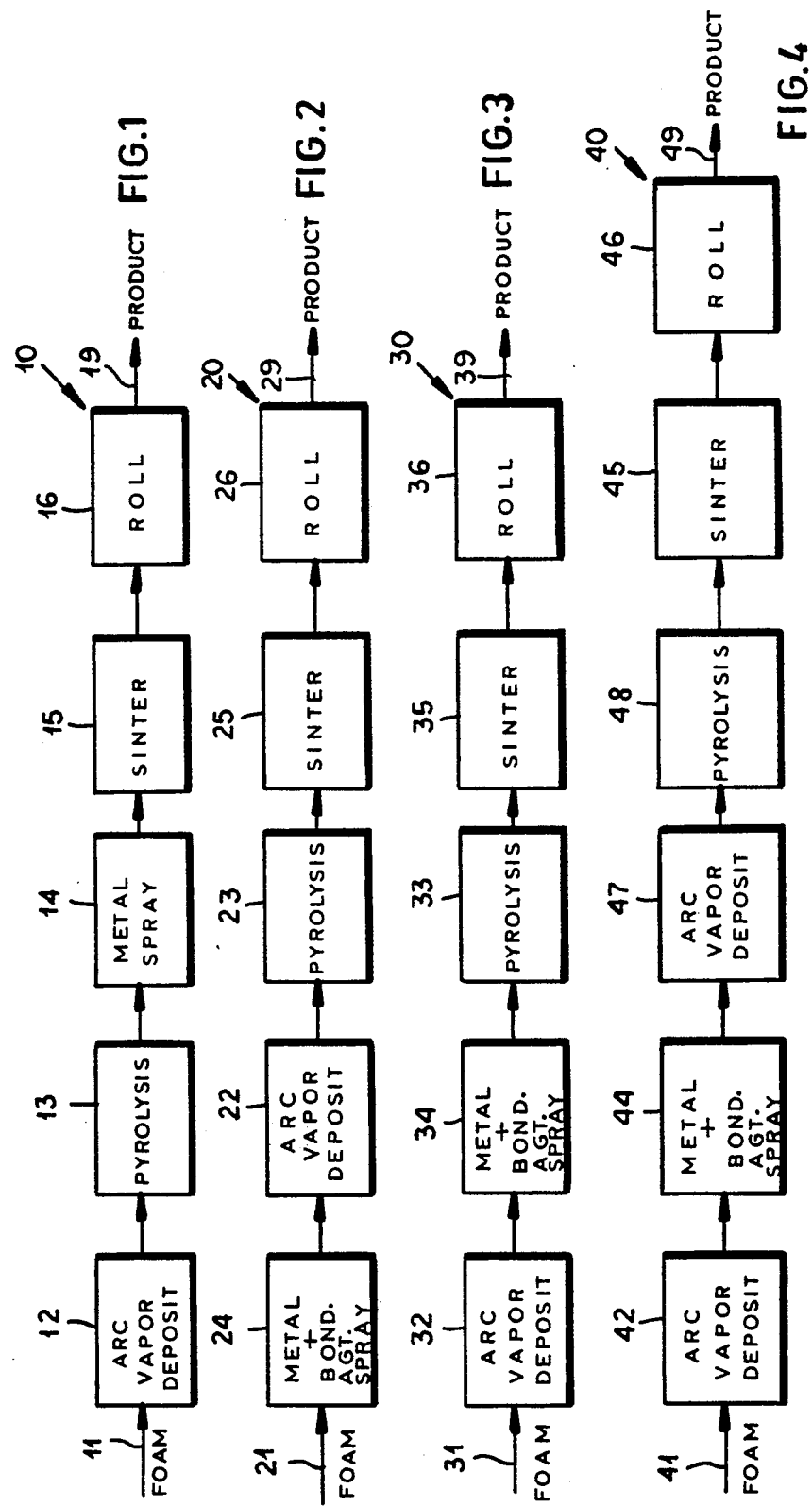

METHOD OF MAKING OPEN-PORE STRUCTURES

CROSS REFERENCE TO RELATED APPLICATIONS

This application is a continuation-in-part application of my copending application Ser. No. 07/208,886 filed June 17, 1988, (now U.S. Pat. No. 4,975,230) which cross refers in turn to Ser. No. 06/941,185 filed Dec. 12, 1986 (now U.S. Pat. No. 4,828,934) and to U.S. patents which may have been copending with the latter application or with an application copending therewith and which are included herewith by reference, these patents including U.S. Pat. No(s). 4,351,855, 4,438,153, 4,505,948, 4,537,794, 4,548,670, 4,565,711, 4,569,307 and 4,575,401.

FIELD OF THE INVENTION

My present invention relates to a method of making an openwork structure, i.e. a structure having a high surface area/volume ratio and, particularly, to structures of that type having a high internal roughness and hence surface activity. The invention relates particularly to such structures which are made from metal, although semiconductive or ceramic structures may also be made in like manner and especially to structures which are intended to be self-supporting and composed of the latter materials but which must have a certain content of the particular material per unit area or volume of the structure to be produced.

The invention also relates to battery electrodes formed from such structures, other products constituted of or utilizing such structures and highly porous devices, including battery electrodes, catalysts, fillers and the like in which such structures are incorporated.

BACKGROUND OF THE INVENTION

In the aforementioned U.S. Pat. No. 4,975,230, I have explained that reticulate metal structures have been generated heretofore for many purposes. For example, such structures may provide a conductive network suitable for use as supports in batteries in which an active material is applied to and held in place by the support, or is formed on the support. Porous structures of this type may also be used as sieves, screens or the like. They may be utilized as catalyst materials and can promote reaction between various phases. In general, they have been characterized by a relatively high surface area per unit volume or weight of the support.

Prior to the method described in U.S. Pat. No. 4,975,230, such materials were produced in a variety of ways. These include chemical vapor deposition, electroless deposition and even electrodeposition on fibrous supports, e.g. nonwoven or needled fabrics. The fibrous support could be destroyed by pyrolysis to leave the reticulate metal structure.

It has been pointed out in the last mentioned copending application, moreover, that these systems had a variety of drawbacks and that, by and large, the systems were not capable of providing the large number of sharp edged or angled surfaces or irregularities that were desirable, especially where specific activity was a main function of the structure made.

In the aforementioned U.S. Pat. No. 4,975,230, therefore, I describe a method utilizing arc vapor deposition for fabricating such structures, especially of metal, that high porosity and, especially, a continuum of the reticulated metal phase and a continuum of the openwork could be obtained, utilizing as a support a foam structure which was pyrolyzable.

Essentially, the method of that application made a reticulate structure by applying to a pyrolyzable openwork substrate, preferably a pyrolyzable foam of a synthetic resin material, by low-temperature arc vapor deposition, a coating of at least one material which was generally a metal but could also be a semiconductor or a ceramic. The coating which is thus formed on the substrate forms an openwork structure which, upon pyrolysis, continues to be an openwork structure.

The coated product, therefore, was subjected to pyrolysis to destroy the synthetic resin support and form a reticulate structure of the metal, for example, which could then be sintered to provide a mechanically stable and coherent, highly porous and branched structure with irregular surfaces.

In the low-temperature arc vapor deposition process there described, which was similar to that set forth in the earlier copending application and patents, the rate of deposition of the metal or other material is a function of the rate at which the material is deposited from the vapor state onto the substrate. While this rate may vary from metal to metal or material to material, it is nevertheless comparatively slow and it is not unusual in depositing 60 grams per square foot on and in the foam synthetic resin for the deposition period to require say 100 hours and even more.

OBJECTS OF THE INVENTION

It is, therefore, the principal object of the present invention to provide a method of making a porous openwork structure which extends the principles of U.S. Pat. No. 4,975,230 so that a product which is substantially equal in quality to that obtained by the method of this latter application can be made at a faster rate.

Another object of the invention is to provide an improved method of making relatively quickly porous openwork structures of metal with a high content of the metal per unit area or volume.

Another object of this invention is to provide an improved method of making materials of high surface area to volume ratio which is more economical than earlier methods.

Yet another object of the invention is to provide an improved method of making a battery electrode with high activity and mechanical strength.

It is also an object of the invention to provide an improved reticulate or openwork structure, particularly a metal structure, which can be used for a variety of purposes and which can be made highly economically, reproducibly and reliably.

SUMMARY OF THE INVENTION

I have now found that it is possible to substitute for at least some of the material which had to be deposited by low-temperature arc vapor deposition in the process described in U.S. Pat. No. 4,975,230, the same material which can be applied by a spray-deposition operation in at least one step or, if desired, a plurality of steps.

It is indeed surprising that, as long as the sprayed material is in contact with a coating applied by low-temperature arc vapor deposition, either before or after, following sintering, the metal structure which results will have the desirable properties of a body made wholly by the low-temperature arc vapor deposition.

Advantageously, the spray deposited metal is applied to the substrate or a prior arc-vapor deposition coating or is coated by an arc vapor deposition coating and is provided with a binder which can be a pyrolyzable material, especially, a pyrolyzable material which can be identical to the pyrolyzable material forming the foam.

When the spray-deposition operation is effected using a mixture of metal and a pyrolyzable synthetic resin, the pyrolysis step should follow the application of the spray deposited layer.

The pyrolysis step in the latter case may, of course, be the same pyrolysis step which removes the foam structure.

Of course, the sintering, compaction and other steps described in U.S. Pat. No. 4,975,230 are used here as well.

It is indeed surprising that a metal spray step, utilizing finely divided metal, especially metal powder with sharp edges, can be employed to bond the metal powder to the substrate and, eventually, to the arc deposited layer without filling the pores of the latter with metal and thereby eliminating the openwork structure, even when the spray deposition is effected after the arc vapor deposition coating has been applied.

As described in U.S. Pat. No. 4,975,230, the substrate is an openwork foam plastic capable of low-temperature thermal decomposition and which may have been pretreated to promote adhesion of the material to be applied, e.g. in a surface activation field such as an electron-beam field or by exposure to a solvent vapor.

The openwork foam plastic support can be coated in the arc vapor deposition stage with the material throughout the thickness of the support by juxtaposing the support with a pair of electrodes between which a low-voltage high-current arc is formed by bringing one of the electrodes into and out of contact with the other while a direct current source is connected across the electrodes to render the electrode contributing material of the coating, relatively cathodic. Surprisingly, the support material while highly sensitive to heat, is not destroyed or fused by this deposition method.

The low-temperature arc vapor deposition coating is preferably carried out in an evacuated space maintained at a pressure no higher than $10^{-3}$ torr and preferably in the range of $10^{-3}$–$10^{-6}$ torr. The space can contain an inert gas or a reactive gas environment, the latter being the case when compounds such as semiconductors or ceramics are to be deposited. The electric source can apply a voltage from 20–150 volts across the electrodes and the source should be capable of delivering 40–50 amperes.

One of the electrodes, at least, should be composed of at least one element of the material to be deposited, e.g. nickel, and advantageously;, both electrodes can be composed of nickel which is progressively evaporated to transform the metal into the vapor state by the cathodic arc discharge and thus permit the vapor to deposit metal upon the substrate.

The spray-deposition coating can be made with spray guns or the like commonly used in spraying polyurethane foam, providing, of course, that means is employed to feed the metal particles to the sprayed foam.

Advantageously, of the total metal deposited and in the finished product, some 20–25% should be made up by metal applied by low-temperature arc vapor deposition in one or more coatings while the balance of 75–80% is made up of the spray deposited powder metal. The powdered metal can have a particle size of 3 to 20 microns.

The foam which is preferentially used as a substrate should be a material which can be thermally decomposed with relative ease. I have found that a reticulated flexible ester-type polyurethane foam provides effective results and the foam mixed as a binder with the powder can have the same composition. Upon foaming, the pore size can be controlled over a wide range of say 10–100 pores per linear inch. The product can have a density which is not related to pore size and can be about 1.75 pounds per cubic foot over this range.

The thickness of the foam to be coated will largely depend on the thickness of the product to be made and it is indeed surprising that the two-phase coating method of the invention can yield uniform deposits of material to considerable thicknesses of the substrate in a wholly unexpected manner. For example, thicknesses of the foam ranging from 1 millimeter to 30 millimeters and more may be coated.

Preferably the foam is of the type described in U.S. Pat. No. 4,670,477 and is made by the method described in that patent or in U.S. Pat. No. 4,656,192.

Polyvinylchloride reticulated foams in which the polyurethane foam as described above is coated with polyvinylchloride in such manner as to preserve the open-pore structure may also be used. I can also employ permanently compressed reticulated foam which is polyurethane foam as described which has been prestressed to increase density.

As in the case of U.S. Pat. No. 4,975,230, the open cell reticulated structure, following sintering, can be compressed to a desired thickness less than the original thickness of the metal structure and the substrate foam. The compression step allows thin sheets of the structure to be formed so that the overall density is increased. As best I can determine, the porosity of the compressed structure is not materially reduced from the porosity of the structure prior to compression utilizing gas flow through the structure as a test. The compression allows thin catalyst sheets to be made.

While preferably the spray-deposition material is identical to that which is applied by low-temperature arc vapor deposition, the spray-deposition material can differ as long as it is compatible with the layer against which it will lie, corrosion phenomena and thermal distortion phenomena do not occur between them.

The method has been found to be particularly suitable for the fabrication of nickel electrode structures, particularly for use in nickel-cadmium and alkaline cells. However, it may be advantageous to provide structures of other metals than nickel or structures which combine nickel with other metals in various proportions. I have found, for example, that it is possible to select a composition of the metal deposited by the low-temperature arc vapor deposition with relative ease in a variety of ways. One approach is to provide a sacrificial electrode of the composition to be deposited so that it is preferentially vaporized. Another approach is to utilize the polarity switching technique of the last mentioned application so that a cathodic arc is established with the electrode from which vaporization is to selectively occur. Another electrode can be provided in addition to the arc striking electrodes and which is vaporized by the arc. This other electrode may consist of a metal to be alloyed with the nickel of one of the arc-striking electrodes.

The pyrolysis is best effected in an electric furnace in the presence of air which can be supplied to the electric furnace at a rate sufficient to allow combustion and thermal degradation of the polyurethane foam so that there is no residue or that any residue is insignificant.

For sufficiently thin substrates, e.g. with a coating of the order of several millimeters, a temperature of about 350° C. and a residence time of about 2 minutes may suffice. Longer times and higher temperatures can be used with thicker coatings or substrates.

The sintering is carried out preferably with exclusion of oxygen, in a vacuum furnace in an inert gas or reducing gas atmosphere at a temperature below the melting point of the metal used but which will be sufficient to cause the metal to sinter without applied pressure. A reducing atmosphere can be used. For example in the case of nickel, a temperature of 750° C. to 1250° C. for a period of the order of 15 minutes can be used in the fabrication of a battery electrode of nickel for a nickel-cadmium or alkaline cell.

The reference herein to the combination of nickel with other metals can include a combination of nickel with say 5 to 10% by weight of other metals which have been found to be advantageous in combination with nickel for various purposes, e.g. in catalyst systems, batteries, or the like. Such other metals can include, for example cobalt.

It will be understood that the combination of arc vapor coating and powder spray can be effected in various ways, depending, for example, upon the thickness of the foam substrate to be coated.

For example, with a substrate having a thickness of the order of 1/16th of an inch of the composition described, the penetration of the coating through the foam is practically uniform so that it is not necessary to coat the substrate on both sides.

For substrates of ⅛th of an inch or more in thickness, it may be advantageous to effect arc vapor deposition coating from both sides.

While generally the powder spray can be applied for only one side, in most cases it has been found to be advantageous to effect powder spraying from both sides of the coated article or substrate.

The application of the powder and the coating can be effected in any order and in various alternations, depending upon the building-up desired.

The preferred embodiments of the invention include:
(a) powder deposition on the foam substrate followed by arc vapor deposition coating pyrolysis and sintering;
(b) arc vapor deposition coating of the foam substrate followed by powder deposition, pyrolysis and sintering;
(c) arc vapor deposition coating of the foam substrate followed by powder coating, followed by arc vapor deposition coating, pyrolysis and sintering; and
(d) arc vapor deposition coating followed by pyrolysis, powder deposition and sintering.

BRIEF DESCRIPTION OF THE DRAWING

The above and other objects, features and advantages of the present invention will become more readily apparent from the following description, reference being made to the accompanying drawing in which:

FIGS. 1-4 are block-type flow diagrams showing four distinct sequences within the method of the present invention; and FIG. 5 is a diagrammatic section, intended to be greatly enlarged, illustrating the result.

SPECIFIC DESCRIPTION

Referring first to FIG. 5 it will be seen that an openwork body 50 may comprise a continuous network or reticulate structure 51 of metal as applied by low-temperature arc vapor deposition in accordance with the principles of U.S. Pat. No. 4,975,230. The interconnected pores of this structure have been represented at 52 and sintered onto the structure 51 is a layer 53 of the powder as applied with the polyurethane binder, but from which the binder has been removed in the pyrolysis step.

In the method sequence of FIG. 1 as shown at 10, the polyurethane foam is employed as indicated at 11 and is subjected to the low-temperature arc vapor deposition as described in the last mentioned application and in conjunction with FIG. 1 thereof in the initial stage 12. As is also described in conjunction with FIG. 1 of this application, the metal coated product is subjected to pyrolysis at 13 and ultimately to sintering at 15 and rolling or compression at 16. Cooling and winding up of the product recovered at 19 can follow. The difference between the sequence 10 and the method described in conjunction with FIG. 1 of U.S. Pat. No. 4,975,230, incorporated herein by reference, is the metal spray stage 14 which here follows pyrolysis. The metal spray can consist of nickel particles of a particle size of 3-20 microns in a binder of foamable liquid polyurethane which can be destroyed in the sintering stage 15.

In FIG. 2 in the method sequence 20, the powdered metal spray is applied at 24 to the foam 21 directly and the arc vapor deposition at 22 is effected upon the sprayed layer. In the pyrolysis stage 23, the foam binder and the foam support are destroyed and the openwork product can be subjected to sintering at 25 and compression at 26 to yield the product of 29.

FIG. 3 shows another method sequence according to the invention of 30 and here the foam 31 is subjected to arc vapor deposition directly at 32 as is the case in FIG. 1. However, the metal spray is applied at 34 directly to the arc-vapor deposited coating and the coated body is then subjected to pyrolysis at 33 to destroy both the binder for the metal powder and the polyurethane support. Sintering and rolling are effected at 35 and 36 as has been described to yield the product 39.

The sequence 40 shown in FIG. 4 is generally similar to that of FIG. 3 except that the polyurethane foam support at 41, after being subjected to coating by arc vapor deposition at stage 42 and to coating with the metal powder spray at 44, receives another coating by arc vapor deposition at 47 utilizing the coating apparatus shown in FIG. 1 of U.S. Pat. No. 4,975,230. The composite structure is then subjected to pyrolysis at 48 to destroy the synthetic resin binders of the spray-deposition coating and the support. The openwork structure is sintered at 45 and compressed at 46 to yield the product at 49.

SPECIFIC EXAMPLE

A nickel openwork structure for use as an electrode material in nickel-cadmium cells is made by subjecting a 80-pore-per-inch open pore flexible reticulated ester-type foam of a density of about 1.75 pounds per cubic foot and a thickness of approximately 1/16 inch to low-temperature arc vapor deposition in a vacuum chamber to which a vacuum of $10^{-5}$ torr has been applied using nickel electrodes. The applied voltage is 40 volts and the arc current is about 75 amperes.

The process is carried out until the substrate is coated to the full thickness thereof and a deposit of about 60 grams of nickel per square foot of the substrate is applied. The coating duration is approximately 75-100 hours. The foam support is destroyed by subjecting the metal coated polyurethane foam to pyrolysis in the presence of air in an electric furnace at a temperature of 350° C. until analysis of the air flowing through the furnace shows that carbon dioxide and carbon monoxide are no longer being generated, thereby indicating the complete decomposition of the polyurethane structure The structure is then subjected to sintering in a vacuum furnace of 950° C.-1250° C., preferably around 1100° C., for a period of 5-60 minutes, preferably around 15 minutes. The nickel structure has up to 95% porosity and a skeletal structure as shown in the scanning electron photomicrographs of FIG. 3 of U.S. Pat. No. 4,975,230.

The process is repeated with all conditions being the same as those given above, except that the low-temperature arc vapor deposition is carried out for only about 20 hours and the balance of the nickel metal to 60 grams per square foot is applied to the arc vapor deposition coating by spraying nickel particles of a particle size range between 5 and 10 microns onto the arc vapor coating in a liquid polyurethane binder pyrolyzable at the pyrolysis temperature. The product after sintering is practically indistinguishable from the product made exclusively by arc vapor deposition coating.

I claim:

1. A method of fabricating an open-pore structure, comprising:
   (a) depositing by arc vapor deposition on and in an openwork synthetic-resin pyrolyzable support a coating of at least one material selected from the group which consists of metals, semiconductors and ceramics by juxtaposing said support with a pair of electrodes at least one of which is composed of at least one element of said material, advancing said electrodes into contact to strike an electric arc between said electrodes and evaporate said element from said one of said electrodes and effect deposition of said material on said support, and evacuating a space in which said support is juxtaposed with such electrodes prior to or during deposition of said coating, whereby a fraction of a total amount of said material adapted to ultimately form said open-pore structure is deposited in the form of said coating;
   (b) spraying onto at least one of said support and said coating in at least one spray-deposition operation a quantity of said material sufficient to make up the remainder of said total amount;
   (c) pyrolyzing said support after at least one of step (a) and step (b) to form an openwork skeleton consisting essentially of said material; and
   (d) sintering said skeleton into a coherent body constituting said open-pore structure.

2. The method defined in claim 1 wherein said spray-deposition operation includes spraying said material in admixture with a pyrolyzable binder and step (c) follows step (b).

3. The method defined in claim 2 wherein said spray-deposition operation of step (b) precedes step (a) and the arc vapor deposition of step (a) is effected upon a layer of said material applied in said spray-deposition operation directly upon said support.

4. The method defined in claim 2 wherein said spray-deposition operation of step (b) follows step (a).

5. The method defined in claim 1 wherein said spray-deposition operation of step (b) precedes step (a) and the arc vapor deposition of step (a) is effected upon a layer of said material applied in said spray-deposition operation directly upon said support.

6. The method defined in claim 1 wherein said spray-deposition operation of step (b) follows step (a).

7. The method defined in claim 6 wherein a further arc vapor deposition deposits an additional portion of said material on the material deposited by said spray-deposition operation.

8. The method defined in claim 1, further comprising the step of compressing said metallic open-pore structure to a reduced thickness while retaining porosity thereof.

9. The method defined in claim 1 wherein step (a) is carried out by applying a vacuum at a pressure no greater than $10^{-3}$ torr to said steps, applying a voltage of 20 to 150 volts across said electrodes and supplying an arc current of 40 to 150 amperes.

10. The method defined in claim 1 wherein said support is a reticulated synthetic resin foam material.

11. The method defined in claim 10 wherein said foam material is a polyurethane foam.

12. The method defined in claim 1 wherein said element is a metal capable of forming an electrode for an electrochemical cell.

13. The method defined in claim 12 wherein said metal is nickel.

14. The method defined in claim 1 wherein said pyrolysis is carried out in the presence of air at a temperature of about 350° C. for a period sufficient to substantially completely eliminate said support.

15. The method defined in claim 14 wherein said sintering is carried out in a vacuum oven in the absence of air or in an inert gas or reducing atmosphere at a temperature between substantially 950° C. to 1250° C. for a period sufficient to sinter said body into a structurally self-supporting state.

16. The method defined in claim 1 wherein 20 to 70 grams per square foot of metal is deposited on said support as said total amount.

17. The method defined in claim 2 wherein said binder is a synthetic resin material pyrolyzable under pyrolysis conditions identical to those at which said support can be pyrolyzed.

18. The method defined in claim 1 wherein the arc-vapor deposition, spray-deposition operations, pyrolysis and sintering are carried out continuously on a continuously advancing web of said support to continuously produce a web of said open-pore metal structure.

* * * * *